US012772370B2

(12) United States Patent
Kieslinger et al.

(10) Patent No.: US 12,772,370 B2
(45) Date of Patent: Oct. 20, 2026

(54) PRINTED CIRCUIT BOARD ARRANGEMENT FOR A MOTOR VEHICLE HEADLIGHT

(71) Applicant: ZKW Group GmbH, Wieselburg (AT)

(72) Inventors: Dietmar Kieslinger, Theresienfeld (AT); Sebastian Schwarz, Pitten (AT)

(73) Assignee: ZKW Group GmbH, Wieselburg (AT)

( * ) Notice: Subject to any disclaimer, the term of this patent is extended or adjusted under 35 U.S.C. 154(b) by 192 days.

(21) Appl. No.: 18/699,492

(22) PCT Filed: Sep. 27, 2022

(86) PCT No.: PCT/EP2022/076760
§ 371 (c)(1),
(2) Date: Apr. 8, 2024

(87) PCT Pub. No.: WO2023/061745
PCT Pub. Date: Apr. 20, 2023

(65) Prior Publication Data

US 2024/0414838 A1 Dec. 12, 2024

(30) Foreign Application Priority Data

Oct. 11, 2021 (EP) .................................... 21201808

(51) Int. Cl.
*H05K 1/02* (2006.01)
*F21S 45/47* (2018.01)

(52) U.S. Cl.
CPC .............. *H05K 1/021* (2013.01); *F21S 45/47* (2018.01); *H05K 2201/066* (2013.01); *H05K 2201/2036* (2013.01); *H05K 2201/2072* (2013.01)

(58) Field of Classification Search
None
See application file for complete search history.

(56) References Cited

U.S. PATENT DOCUMENTS 4,974,119 A * 11/1990 Martin ................. H05K 3/0061 361/708
5,730,210 A * 3/1998 Kou ......................... H05K 7/12 257/E23.084

(Continued)

FOREIGN PATENT DOCUMENTS

DE 102007034123 A1 1/2009
WO 2004070839 A2 8/2004

OTHER PUBLICATIONS

Extended European Search Report for European Patent Application No. 21201808.9 dated Mar. 21, 2022 (5 Pages).

(Continued)

*Primary Examiner* — Krystal Robinson
(74) *Attorney, Agent, or Firm* — Eversheds Sutherland (US) LLP

(57) ABSTRACT

Printed circuit board arrangement (10) for a motor vehicle headlight, comprising a printed circuit board (50) and a heat sink (60), which are spaced apart from one another by a distance (X) at least in some areas in such a way that a gap (70) is formed between the printed circuit board (50) and the heat sink (60), wherein the printed circuit board (50) is attached to the heat sink (60) with at least one attachment device (80) while maintaining the gap (70), wherein the at least one attachment device (80) comprises the following:

Figure 1:
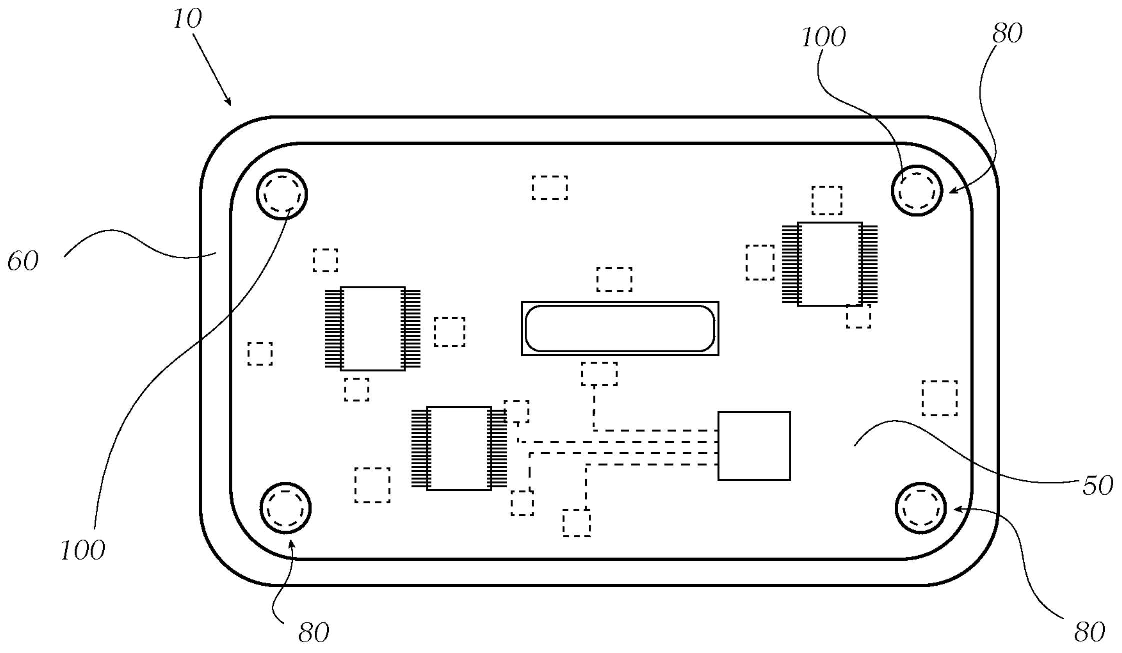

- an attachment opening (100), which attachment opening (100) completely passes through the printed circuit board (50),
- a recess (200), which is arranged on the heat sink (70), and which has an insertion opening (210),
- an attachment element (300) with a longitudinal axis (A), wherein through exertion of a force (F) on an engagement section (310) and an opposing force on a contact section (320), the attachment element (300) is deformed in such a way that the (Continued)

attachment element (300) is clamped in the recess (200) in a form-fitting manner and a first and a second widening section (330*a*, 330*b*) of the attachment element (300) is formed, wherein the first widening section (330*a*) extends into the gap (70) and beyond the opening size of the attachment opening (100) such that the first widening section (330*a*) supports the printed circuit board (50), wherein the second widening section (330*b*) extends radially to the longitudinal axis (A) beyond the opening size.

12 Claims, 4 Drawing Sheets

(56) References Cited

U.S. PATENT DOCUMENTS 6,049,469 A * 4/2000 Hood, III ............. H05K 9/0039 438/122
6,334,750 B1 * 1/2002 Hsieh ...................... F16B 5/065 24/453
6,364,688 B1 * 4/2002 Fraley .................. H01R 13/639 411/7
6,679,712 B2 * 1/2004 Chang ................. H10W 40/641 411/21
7,023,699 B2 * 4/2006 Glovatsky .......... H05K 7/20454 361/708
7,679,917 B2 * 3/2010 Deck .................... H05K 7/2049 257/179
8,373,990 B2 * 2/2013 Jarmany .............. H05K 7/2049 361/752
8,964,392 B2 * 2/2015 Kovatchev ........... H05K 1/0218 174/262
11,765,835 B2 * 9/2023 Kinghorn ............. H05K 1/0207 174/252
2008/0192440 A1 * 8/2008 Meng .................. H10W 40/641 361/709
2012/0257360 A1 * 10/2012 Sun ...................... H01R 12/716 361/748
2013/0075567 A1 * 3/2013 Fu ....................... H10W 40/611 248/346.04
2013/0094141 A1 * 4/2013 Degner ................... B23P 15/26 29/890.032
2013/0126214 A1 * 5/2013 Lin ..................... H10W 40/641 174/250
2014/0055955 A1 * 2/2014 Chen ..................... H10W 40/60 403/327
2015/0041186 A1 * 2/2015 Huang ................ H10W 40/641 24/453
2015/0144317 A1 * 5/2015 Lin ........................... F28F 3/00 165/185
2015/0201533 A1 * 7/2015 Daughtry, Jr. ..... H05K 13/0465 29/840
2015/0260390 A1 * 9/2015 Bretschneider ..... F21V 19/0055 362/373
2016/0029480 A1 * 1/2016 Augoustidis ........... H05B 33/06 174/254
2016/0181480 A1 * 6/2016 Cumpston .............. H05K 1/184 174/255
2017/0189092 A1 * 7/2017 Bonutti .............. A61B 17/0401
2019/0223318 A1 7/2019 Inoue et al.
2021/0025562 A1 1/2021 Sato et al.
2024/0155819 A1 * 5/2024 Lee ...................... H05K 9/0022

OTHER PUBLICATIONS

Search Report and Written Opinion for International Patent Application No. PCT/EP2022/076760 dated Feb. 14, 2023 (14 Pages).

* cited by examiner

PRINTED CIRCUIT BOARD ARRANGEMENT FOR A MOTOR VEHICLE HEADLIGHT

The invention relates to a printed circuit board arrangement for a motor vehicle headlight, comprising a printed circuit board and a heat sink, which is in thermal contact with the printed circuit board and is designed to dissipate heat from the printed circuit board, wherein the printed circuit board and the heat sink are spaced apart from one another by a distance at least in some areas in such a way that a gap is formed between the printed circuit board and the heat sink, wherein the printed circuit board is attached to the heat sink with at least one attachment device while maintaining the gap, which attachment device comprises at least the following:

an attachment opening with an opening size, which attachment opening completely passes through the printed circuit board, a recess, which is arranged on the heat sink, and which has an insertion opening, and an attachment element with a longitudinal axis, wherein the attachment element has an engagement section and a contact section lying opposite along the longitudinal axis.

The invention further relates to a motor vehicle headlight comprising at least one printed circuit board arrangement according to the invention.

In order to thermally connect a printed circuit board and an associated heat sink, the printed circuit board is mechanically placed on the heat sink, wherein manufacturing errors, inter alia, can result in the printed circuit board not coming to rest flat in every area on the heat sink and a gap being present in some areas between the printed circuit board and the heat sink.

Common attachment methods from the prior art for attaching printed circuit boards to heat sinks include, inter alia, screws and rivets.

However, the use of such attachment means can lead to the printed circuit board bending in the area of the attachment due to constant contact pressure of the screws or rivets, causing components and their electrical connections to the printed circuit board to either break or the conductor tracks and components arranged on the printed circuit board to be damaged or destroyed.

Due to this deformation, which is particularly pronounced in the vicinity of the attachment points, electronic components can only be assembled at a relatively large distance from the attachment points. An attachment device that reduces the contact pressure and thus also the deformation of the printed circuit board would thus make it possible to reduce the distance between the electronic component and attachment point and thus minimize the overall size of the printed circuit board.

It is an object of the invention to provide an improved printed circuit board arrangement.

This object is achieved by virtue of the fact that the attachment opening and the insertion opening are arranged to overlap in such a manner that the attachment element is received through the attachment opening and the insertion opening, wherein the attachment element passes through the printed circuit board via the attachment opening, and wherein through exertion of a force on the engagement section and an opposing force on the contact section, the attachment element is deformed in such a way that the attachment element is clamped in the recess in a form-fitting manner and a first and a second widening section of the attachment element is formed, wherein the first widening section extends into the gap between the printed circuit board and the heat sink radially to the longitudinal axis of the attachment element, wherein the first widening section extends beyond the opening size of the attachment opening into the gap in such a way that the first widening section supports the printed circuit board in order to maintain the distance between the printed circuit board and the heat sink in the area of the attachment opening, and wherein the second widening section extends radially to the longitudinal axis of the attachment element, wherein the second widening section extends beyond the opening size of the attachment opening in order to maintain the distance between the printed circuit board and the heat sink in the area of the attachment opening, and wherein the printed circuit board is clamped between the first and the second widening section of the attachment element in a form-fitting manner in the area of the attachment opening.

It can be provided that the attachment element is pin-shaped.

It can be provided that the attachment element is made of plastic or a metal, preferably of aluminium or an aluminium alloy.

In general, it should be noted that the material of the attachment element should be selected in such a way that the modulus of elasticity of the attachment element is smaller than that of the heat sink. In addition, it should be noted that the expansion coefficients of the different materials are selected in such a way that the connection cannot come apart in the application temperature range, even if there are large temperature fluctuations. Furthermore, when selecting the material of the attachment element, the environmental influences that occur in the automotive industry, such as large temperature fluctuations and vibrations, should be taken into account.

It can be provided that a thermally conductive material is arranged in the gap in order to enable a better thermal connection between the printed circuit board and the heat sink.

It can be provided that the recess comprises at least one undercut such that the attachment element is secured against a movement along the longitudinal axis by the form-fitting connection between the attachment element and the recess.

It can be provided that the recess is designed as a blind hole on the heat sink, wherein the blind hole has an abutment section, on which abutment section the contact section of the attachment element rests and is provided to exert the opposing force.

It can also be provided that the recess is designed as a recess passing completely through the heat sink.

It can be provided that the printed circuit board arrangement comprises an abutment element, on which the contact section of the attachment element rests and is provided to exert the opposing force, wherein the abutment element is formed by a component separate from the heat sink. It can also be provided that after the force has been exerted on the attachment element and after the resulting form-fit has been created, said abutment element can be removed again from the heat sink if necessary.

It can be provided that the attachment element is trapezoidal in a cross-section parallel to the longitudinal axis, wherein two leg elements are preferably arranged at the base of the trapezoid at a distance from one another transverse to the longitudinal axis.

It can be provided that the attachment element is deformed by extrusion. The term "extrusion" means that a force acting on a material creates a compressive stress in the material which, if it exceeds the compressive yield point of the material, leads to the material flowing. If no more force is applied to the component, a plastic deformation of the component remains after the elastic springback.

It can be provided that at least one spacer is arranged in the gap between the heat sink and the printed circuit board to ensure that the gap is maintained, preferably to ensure that a minimum gap between the heat sink and the printed circuit board is maintained.

Furthermore, the object is also achieved by a motor vehicle headlight comprising at least one printed circuit board arrangement according to the invention.

Figure 3A:
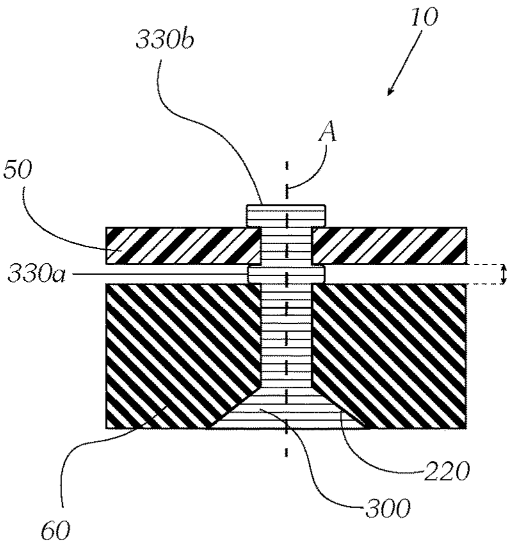
Figure 3B:
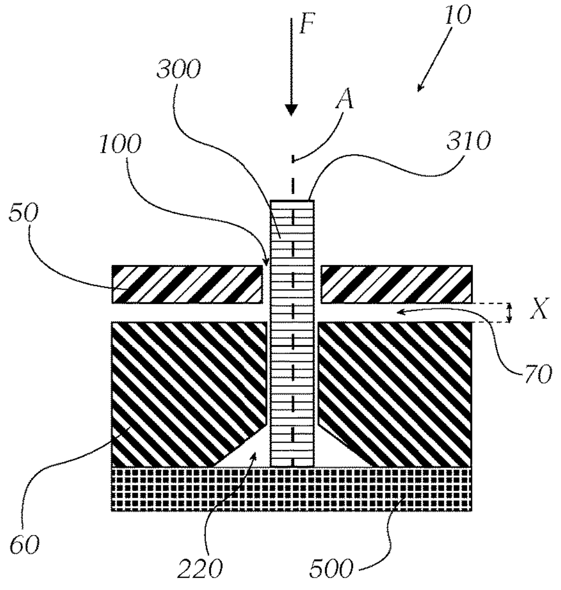
Figure 4A:
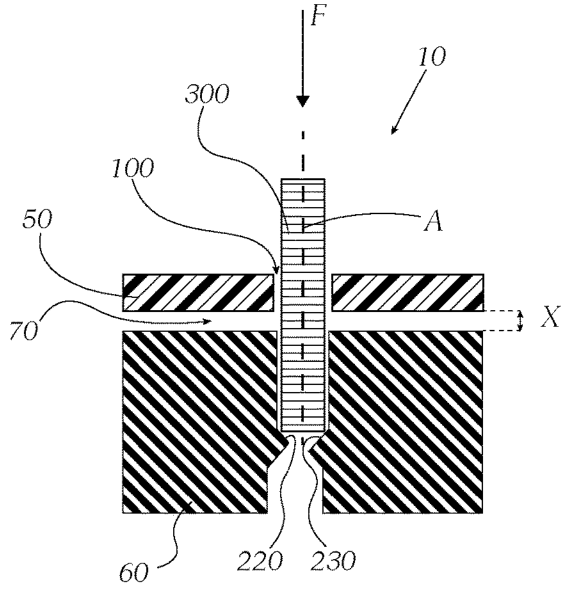
Figure 4B:
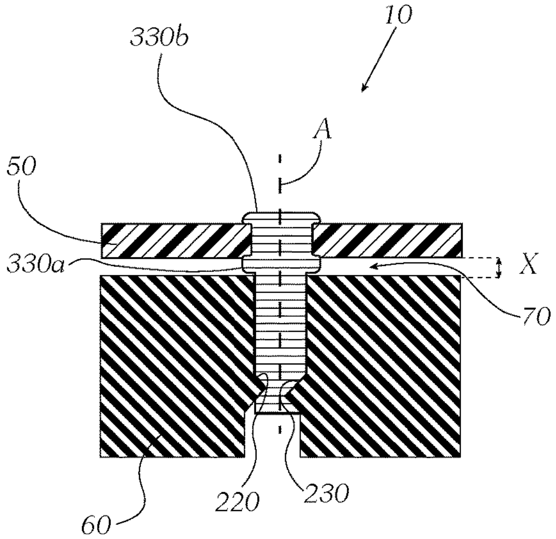
Figure 5:
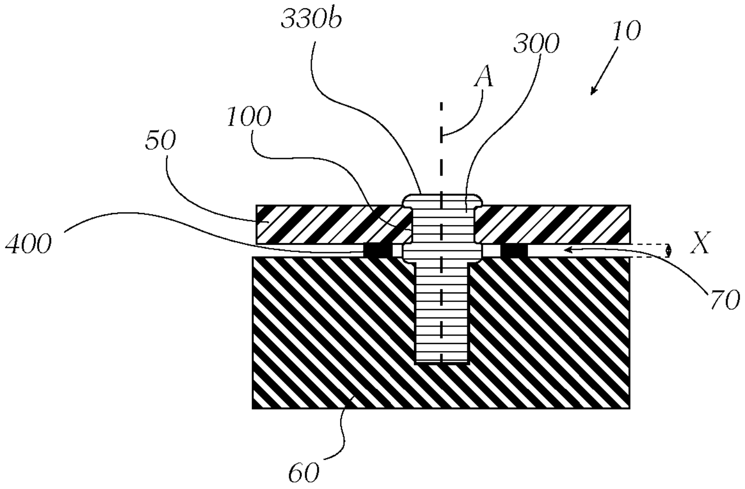
Figure 6:
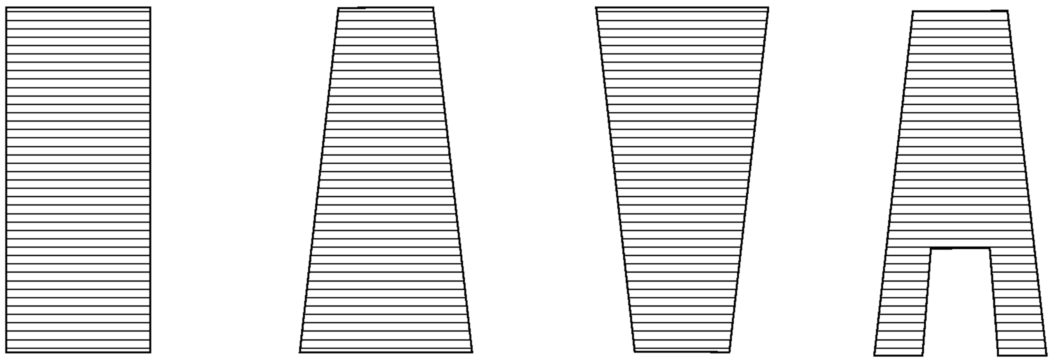

The invention is explained below in more detail based on exemplary drawings. In the drawings, FIG. 1 shows an exemplary printed circuit board arrangement in a view from above, wherein the printed circuit board arrangement comprises a heat sink and a printed circuit board attached thereto by means of attachment devices, FIG. 2A shows an exemplary attachment device in a cross-section of the printed circuit board arrangement, wherein the attachment device comprises an attachment opening in the printed circuit board, a recess in the heat sink and an attachment element, which attachment element is deformed by means of exertion of a force and opposing force, FIG. 2B shows the exemplary attachment device shown in FIG. 2A before the force and opposing force have been exerted on the attachment element, FIG. 3A shows the exemplary attachment device shown in FIG. 3B after the force and opposing force have been exerted on the attachment element, FIG. 3B shows a further exemplary attachment device in a state before force has been exerted on the attachment element, FIG. 4A shows a further example of an attachment device before force exertion for deforming the attachment element, FIG. 4B shows the example shown in FIG. 4A after deformation of the attachment element, FIG. 5 shows a further example of an attachment device, wherein the attachment device further comprises spacers, and FIG. 6 shows several examples of possible attachment elements.

FIG. 1 shows an exemplary printed circuit board arrangement 10 for a motor vehicle headlight, comprising a printed circuit board 50 and a heat sink 60 in a view from above, wherein the heat sink is in thermal contact with the printed circuit board 50 and is designed to dissipate the heat from the printed circuit board 50 generated during operation of the printed circuit board 50.

Figure 2A:
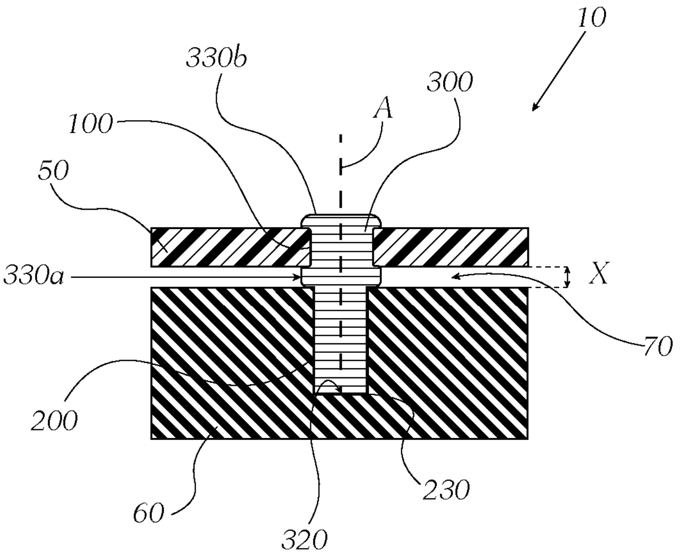
Figure 2B:
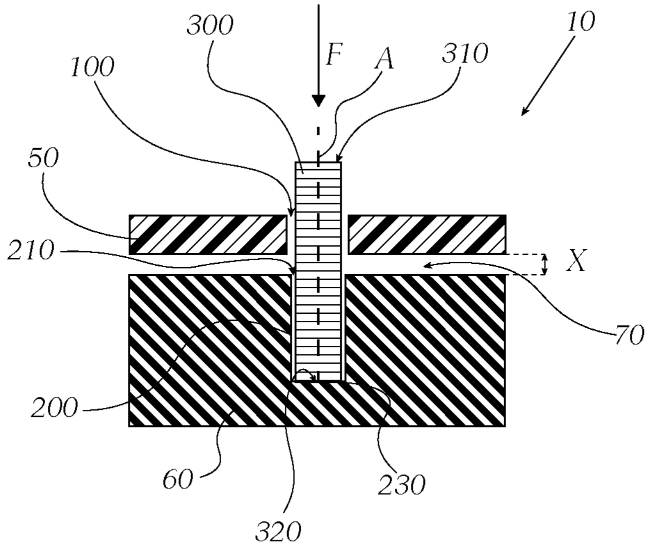

As shown in FIG. 2*a* and FIG. 2*b*, the printed circuit board 50 and the heat sink 60 are spaced apart from one another by a distance X at least in some areas in such a way that a gap 70 is formed between the printed circuit board 50 and the heat sink 60, wherein the printed circuit board 50 is attached to the heat sink 60 with several attachment devices 80 while maintaining the gap 70. Examples of possible embodiments of attachment devices 80 are shown in the figures below.

The attachment devices 80 respective comprise an attachment opening 100 with an opening size, which attachment opening 100 completely passes through the printed circuit board 50, a recess 200, which is arranged on the heat sink 70, and which has an insertion opening 210, an attachment element 300 with a longitudinal axis A, wherein the attachment element 300 has an engagement section 310 and a contact section 320 lying opposite along the longitudinal axis A, as shown, for example, in FIG. 2A. In the example shown, the attachment element 300 is pin-shaped, wherein other shapes are also conceivable, such as a trapezoidal attachment element in a cross-section parallel to the longitudinal axis A. Other shapes are also shown in FIG. 6.

The attachment element 300 is made of aluminium or an aluminium alloy in the examples shown.

The attachment opening 100 and the insertion opening 210 are arranged to overlap in such a manner that the attachment element 300 is received through the attachment opening 100 and the insertion opening 210, wherein the attachment element 300 passes through the printed circuit board 50 via the attachment opening 100.

Through exertion of a force F on the engagement section 310 and an opposing force on the contact section 320, the attachment element 300 is deformed in such a way that the attachment element 300 is clamped in the recess 200 in a form-fitting manner and a first and a second widening section 330*a*, 330*b* of the attachment element 300 is formed. Deformation is achieved in the examples shown by means of extrusion.

In the example shown in FIG. 2A, the recess 200 is designed as a blind hole on the heat sink 60, wherein the blind hole has an abutment section 230, on which abutment section 230 the contact section 320 of the attachment element 300 rests and is provided to exert the opposing force.

The first widening section 330*a* extends into the gap 70 between the printed circuit board 50 and the heat sink 60 radially to the longitudinal axis A of the attachment element 300, wherein the first widening section 330*a* extends beyond the opening size of the attachment opening 100 into the gap 70 in such a way that the first widening section 330*a* supports the printed circuit board 50 in order to maintain the distance X between the printed circuit board 50 and the heat sink 60 in the area of the attachment opening 100.

The second widening section 330*b* extends radially to the longitudinal axis A of the attachment element 300, wherein the second widening section 330*b* extends beyond the opening size of the attachment opening 100 in order to maintain the distance X between the printed circuit board 50 and the heat sink 60 in the area of the attachment opening 100 and in order to secure the printed circuit board 50 against a movement in the opposite direction to the recess 200.

The printed circuit board 50 is clamped between the first and the second widening section 330*a*, 330*b* of the attachment element 300 in a form-fitting manner.

FIG. 2B shows the attachment device 80 shown in FIG. 2A in a state before the attachment element 300 is deformed by means of extrusion.

FIG. 3A shows a further example of an attachment device 80, wherein the above also applies. The difference to the previous example is that the recess 200 is designed as a recess 200 passing completely through the heat sink 60 and that the recess 200 comprises an undercut 220 such that the attachment element 300 is secured against a movement along the longitudinal axis A by the form-fitting connection between the attachment element 300 and the recess 200 in addition to being clamped.

FIG. 3B shows the attachment device 80 shown in FIG. 3A in a state before the attachment element 300 is deformed by means of extrusion, wherein a temporarily arranged counter-holder or abutment element 500 is provided to produce the opposing force.

FIG. 4A and FIG. 4B show a further example of an attachment device 80, wherein the recess 200 comprises an abutment section 230 for producing the opposing force, which functions at the same time as an undercut within the meaning of the previous example.

FIG. 5 shows a further example of an exemplary attachment device 80, wherein the above also applies to this example. The difference to the previous examples, in particular the example shown in FIG. 2A or FIG. 2B is that the attachment device 80 comprises spacers 400, which are arranged in the gap 70 between the heat sink 60 and the printed circuit board 50 to additionally improve the maintenance of the gap 70 or ensure that the gap 70 is maintained.

FIG. 6 shows possible embodiments of the attachment element 300, wherein the scope of protection does not relate exclusively to the geometric shapes shown here. The first shape from the right in FIG. 6 constitutes a particularly advantageous shape for the attachment element. The attachment element is trapezoidal in a cross-section parallel to the longitudinal axis, wherein two leg elements are arranged at the base of the trapezoid at a distance from one another transverse to the longitudinal axis.

REFERENCE LIST

Printed circuit board arrangement . . . 10
Printed circuit board . . . 50
Heat sink . . . 60
Gap . . . 70
Attachment devices . . . 80
Attachment opening . . . 100
Recess . . . 200
Insertion opening . . . 210
Undercut . . . 220
Abutment section . . . 230
Attachment element . . . 300
Engagement section . . . 310
Contact section . . . 320
First widening section . . . 330*a*
Second widening section . . . 330*b*
Spacer . . . 400
Counter-holder . . . 500
Longitudinal axis . . . A
Distance . . . X

The invention claimed is:

1. A printed circuit board arrangement (10) for a motor vehicle headlight, the arrangement comprising:

a printed circuit board (50); and a heat sink (60), which is in thermal contact with the printed circuit board (50) and is configured to dissipate heat from the printed circuit board (50), wherein the printed circuit board (50) and the heat sink (60) are spaced apart from one another by a distance (X) at least in some areas in such a way that a gap (70) is formed between the printed circuit board (50) and the heat sink (60), wherein the printed circuit board (50) is attached to the heat sink (60) with at least one attachment device (80) while maintaining the gap (70), which at least one attachment device (80) comprises:

an attachment opening (100) with an opening size, which attachment opening (100) completely passes through the printed circuit board (50), a recess (200), which is arranged on the heat sink (60), and which has an insertion opening (210), and an attachment element (300) with a longitudinal axis (A), wherein the attachment element (300) has an engagement section (310) and a contact section (320) lying opposite to each other along the longitudinal axis (A), wherein the attachment opening (100) and the insertion opening (210) are arranged to overlap in a thickness direction such that the attachment element (300) is received through the attachment opening (100) and the insertion opening (210), wherein the attachment element (300) passes through the printed circuit board (50) via the attachment opening (100), wherein through exertion of a force (F) on the engagement section (310) and an opposing force on the contact section (320), the attachment element (300) is deformed in such a way that the attachment element (300) is clamped in the recess (200) in a form-fitting manner and a first and a second widening section (330*a*, 330*b*) of the attachment element (300) is formed, wherein the first widening section (330*a*) extends into the gap (70) between the printed circuit board (50) and the heat sink (60) radially outward from the longitudinal axis (A) of the attachment element (300), wherein the first widening section (330*a*) extends beyond the opening size of the attachment opening (100) into the gap (70) in such a way that the first widening section (330*a*) supports the printed circuit board (50) in order to maintain the distance (X) between the printed circuit board (50) and the heat sink (60) in the area of the attachment opening (100), wherein the second widening section (330*b*) extends radially to the longitudinal axis (A) of the attachment element (300), wherein the second widening section (330*b*) extends beyond the opening size of the attachment opening (100) in order to maintain the distance (X) between the printed circuit board (50) and the heat sink (60) in the area of the attachment opening (100) and in order to secure the printed circuit board (50) against a movement in the opposite direction to the recess (200), wherein the printed circuit board (50) is clamped between the first and the second widening section (330*a*, 330*b*) of the attachment element (300) in a form-fitting manner.

2. The printed circuit board arrangement according to claim 1, wherein the attachment element (300) is pin-shaped.

3. The printed circuit board arrangement according to claim 1, wherein the attachment element (300) is made of plastic or a metal.

4. The printed circuit board arrangement according to claim 3, wherein the attachment element (300) is made of aluminium or an aluminium alloy.

5. The printed circuit board arrangement according to claim 1, wherein the recess (200) comprises at least one undercut (220) such that the attachment element (300) is secured against a movement along the longitudinal axis (A) by the form-fitting connection between the attachment element (300) and the recess (200).

6. The printed circuit board arrangement according to claim 1, wherein the recess (200) is configured as a blind hole on the heat sink (60), wherein the blind hole has an abutment section (230), on which abutment section (230) the contact section (320) of the attachment element (300) rests and is provided to exert the opposing force.

7. The printed circuit board arrangement according to claim 1, wherein the recess (200) is configured as a recess (200) passing completely through the heat sink (60).

8. The printed circuit board arrangement according to claim 1, wherein the attachment element (300) is trapezoidal in a cross-section parallel to the longitudinal axis (A), wherein two leg elements are arranged at the base of the trapezoid at a distance from one another transverse to the longitudinal axis (A).

9. The printed circuit board arrangement according to claim 1, wherein the attachment element (300) is deformed by extrusion.

10. The printed circuit board arrangement according to claim 1, wherein at least one spacer (400) is arranged in the gap (70) between the heat sink (60) and the printed circuit board (50) to ensure that the gap (70) is maintained.

11. The printed circuit board arrangement according to claim 1, wherein the printed circuit board arrangement (10) comprises an abutment element (500), on which the contact section (320) of the attachment element (300) rests and is provided to exert the opposing force, wherein the abutment element (500) is formed by a component separate from the heat sink, wherein the abutment element (500) can be removed from the heat sink after the force has been exerted on the attachment element (300) and after the resulting form-fit has been created.

12. A motor vehicle headlight comprising at least one printed circuit board arrangement (10) according to claim 1.

* * * * *